United States Patent [19]

Ouchi et al.

[11] Patent Number: 4,591,398
[45] Date of Patent: May 27, 1986

[54] METHOD FOR MANUFACTURING A SEMICONDUCTOR DEVICE UTILIZING SELF-ALIGNED OXIDE-NITRIDE MASKING

[75] Inventors: Norikazu Ouchi; Akio Kayanuma; Katsuaki Asano, all of Tokyo, Japan

[73] Assignee: Sony Corporation, Tokyo, Japan

[21] Appl. No.: 700,707

[22] PCT Filed: May 25, 1984

[86] PCT No.: PCT/JP84/00271

§ 371 Date: Jan. 25, 1985

§ 102(e) Date: Jan. 25, 1985

[87] PCT Pub. No.: WO84/04853

PCT Pub. Date: Dec. 6, 1984

[30] Foreign Application Priority Data

May 26, 1983 [JP] Japan .................... 58-92697

[51] Int. Cl.[4] .................... H01L 21/20; H01L 21/302
[52] U.S. Cl. .................... 148/187; 29/576 E;
29/578; 29/580; 148/175; 148/DIG. 26;
148/DIG. 50; 148/DIG. 103; 148/DIG. 106;
156/612; 156/643; 156/649; 156/653; 156/657;
357/34; 357/59
[58] Field of Search ............. 148/187, 175, DIG. 106,
148/DIG. 26, DIG. 103, DIG. 50; 29/578, 580,
576 E; 156/612, 643, 649, 653, 657; 357/34, 59

[56] References Cited

U.S. PATENT DOCUMENTS 3,611,067 10/1971 Oberlin et al. .................. 148/175 X
4,127,931 12/1978 Shiba .................. 29/578 X
4,168,999 9/1979 Vora et al. .................. 148/175
4,278,987 7/1981 Imaizumi et al. .................. 148/175 X
4,481,706 11/1984 Roche .................. 29/578 X
4,504,332 3/1985 Shinada .................. 148/187

FOREIGN PATENT DOCUMENTS 50-11676 2/1975 Japan .
55-39677 3/1980 Japan .

OTHER PUBLICATIONS

Anantha et al., "High-Voltage Power Transistor", I.B.M. Tech. Discl. Bull., vol. 16, No. 9, Feb. 1974, pp. 2874-2875.
Silvestri et al., "Reproducible Technique . . . Simultaneous Deposition . . . ", I.B.M. Tech. Discl. Bull., vol. 23, No. 2, Jul. 1980, pp. 819-820.

Primary Examiner—William G. Saba
Attorney, Agent, or Firm—Hill, Van Santen, Steadman & Simpson

[57] ABSTRACT

The present invention is to provide a method for manufacturing a semiconductor device of high efficiency and high integration density. The method for manufacturing a semiconductor device comprises the steps of forming semiconductive layers (30), (31) and (31') having on the surface thereof a concave portion, forming a nitride layer (35) within the concave portions forming with the nitride layer (35) as a mask an oxide layer (39) on the surface of the semiconductive layer (30), removing said nitride layer (35) and introducing an impurity into the semiconductive layers (31) and (31') with the oxide layer (39) as a mask. In accordance therewith, the elements can be made finer and hence the method of this invention is suitable for manufacturing an IC device high in efficiency and high in integration density.

7 Claims, 16 Drawing Figures

METHOD FOR MANUFACTURING A SEMICONDUCTOR DEVICE UTILIZING SELF-ALIGNED OXIDE-NITRIDE MASKING

DESCRIPTION

1. Technical Field

This invention relates to a method for manufacturing a semiconductor device, particularly an IC device of a bipolar transistor.

2. Background Art

As a prior art method for separating elements of a semiconductor integrated circuit (IC), there is known, for example, a selective oxidation (LOCOS) method. FIG. 1 is a cross-sectional view of a main part of a bipolar transistor IC that is manufactured by using the selective oxidation method. In the figure, reference numeral 1 designates a silicon semiconductor substrate of, for example, P type. Reference numeral 2 designates a collector embedded layer of N+ type, reference numeral 3 designates a collector region formed of an N type epitaxial growth layer, reference numeral 4 designates a base region, reference numeral 5 designates an emitter region, reference numeral 6 designates an $SiO_2$ layer formed by the selective oxidation method and reference numeral 7 designates a portion from which a collector electrode is led out. Reference letters C, E and B respectively designate terminal for the collector, emitter and base. However, the selective oxidation process for manufacturing this bipolar transistor IC has the following problems. That is, if a bird's beak (the bird's beak protrudes to approximately $1\mu$) and a bird's head are generated as shown in FIG. 1, when the window is opened upon selective oxidation process and the window is opened for the emitter region, the mask alignments are respectively necessary; in this case, the tolerance including the alignment precision and the bird's beak is necessary; since the spacing between the base electrode leading-out portion and the emitter electrode leading-out portion is determined by the tolerance of the Al electrode, there is a limit to make the spacing narrow; the parasitic capacity of the collector is considerably affected by the region except the active region (so-called intrinsic portion); and the above problems give a limit on making the cell size smaller, etc.

While, in order to solve such problems, the present applicant has proposed a manufacturing method for producing a bipolar transistor IC as shown in FIG. 2 (refer to Japanese patent application No. 62701/1983). In this manufacturing method, an N+ type collector embedded layer 2 is formed first in a silicon semiconductive substrate 1 of, for example, P type. Thereafter, window apertures 9 and 10 are selectively formed through predetermined portions of the insulating film, for example, an $SiO_2$ film 8 on the major surface of the substrate, namely, the portions corresponding to the active region and the collector electrode leading-out portion of the transistor. Then, the whole surface including the $SiO_2$ film 8 and the window apertures 9 and 10 is subjected to the vapor phase growth treatment, whereby a single crystal silicon 16 is formed within the window apertures 9 and 10 and a polycrystalline silicon 17 is formed on the $SiO_2$ layer 8. Thereafter, the single crystal silicon 16 and the polycrystalline silicon 17 are flattened and the polycrystalline silicon 17 is selectively removed. Then, formed on the single crystalline silicon 16 within the window aperture 9 are an N− type collector region 3, a P type base region 4 and an N+ type emitter region 5 and the polycrystalline silicon 17 is made as the base electrode lead-out portion, while formed on the single crystalline silicon 16 within the other window aperture 10 is an N+ type collector electrode lead-out portion, thus a bipolar transistor IC being formed. According to this manufacturing method, no bird's beak and no bird's head are produced, the parasitic capacity of the collector can be reduced and the cell size can be decreased, etc. However, as will be clear from FIG. 2, although the base region 4, the emitter region 5 and the emitter electrode lead-out portion 11 are formed in a self-alignment fashion, between the collector region 3 and the base region 4 there is a difference in size as L and l and they can not be formed in the self-alignment fashion, thus the alignment precision and the tolerance being required.

In view of the above aspect, this invention is to provide a method for manufacturing a semiconductor device capable of solving the problem of the separation between the elements caused by the selective oxidation method and in which the respective collector, base and emitter regions and the emitter electrode lead-out portions are formed in the self-alignment fashion so as to permit the elements to be more smaller and an IC device of high efficiency and high integration density can be manufactured.

DISCLOSURE OF INVENTION

This invention relates to a method for manufacturing a semiconductor device which comprises the steps of forming a semiconductive layer having on its surface formed a concave portion, forming a nitride layer within this concave portion, forming an oxide layer on a surface of the semiconductive layer with the nitride layer as a mask, removing this nitride layer and introducing an impurity into the semiconductive layer with the oxide layer as a mask. Thus, the element can be made finer and it is possible to obtain the IC device of high efficiency and high integration density.

BEST MODE FOR CARRYING OUT THE INVENTION

An embodiment of a method for manufacturing a semiconductor device according to this invention will hereinafter be described with reference to FIG. 3. In this embodiment, the present invention is applied to an NPN transistor, but it is needless to say that this invention can also be applied to a PNP transistor.

Figure 1:
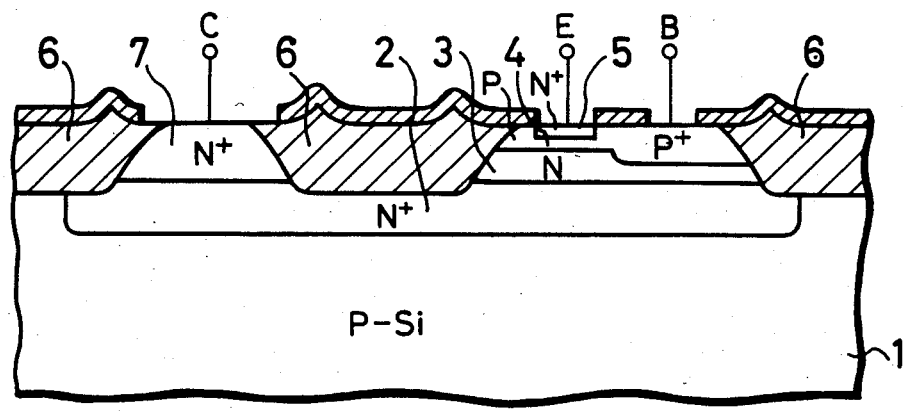
FIGS. 1 and 2 are cross-sectional views of bipolar transistors manufactured by a prior art manufacturing method.
Figure 2:
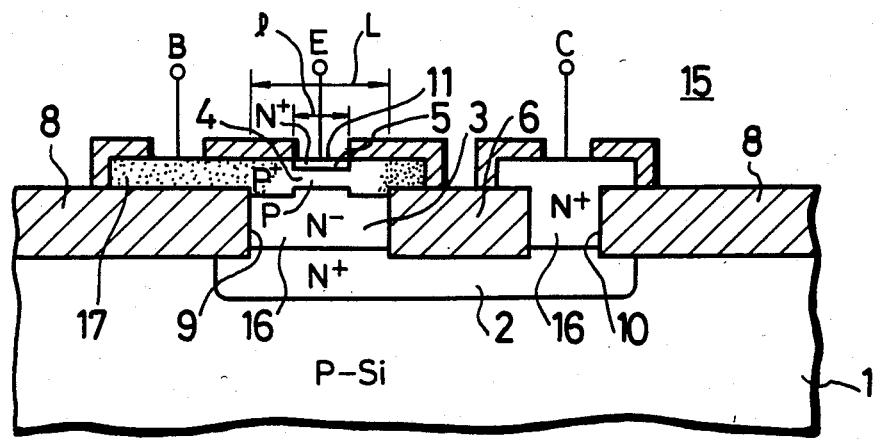
Figure 3A:
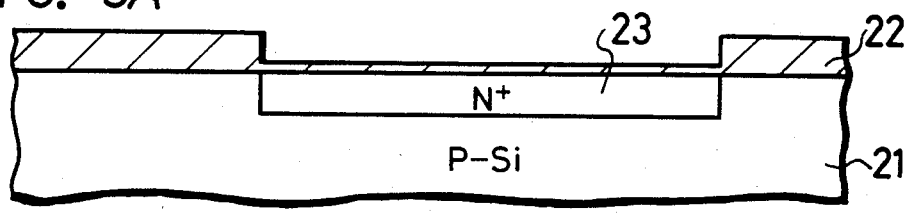
FIGS. 3A to 3M are cross-sectional views of an embodiment of this invention in process order.

In this embodiment, as shown in FIG. 3A, after an oxide layer ($SiO_2$) 22 is formed on a P type silicon semiconductive substrate 21, a window is formed through this oxide layer 22 and an N type impurity is diffused into the substrate 21 through the window so as to form an N type collector embedded layer 23.

Figure 3B:
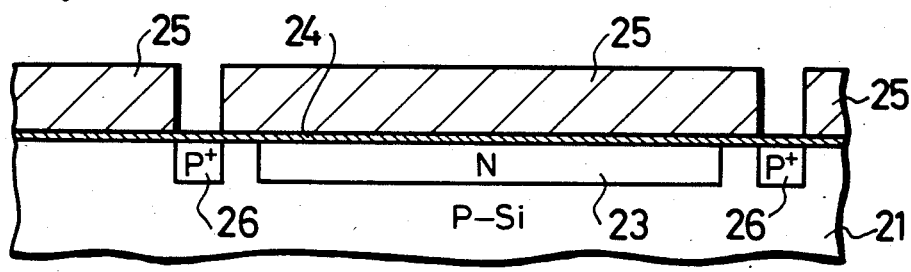

Then, as shown in FIG. 3B, after the oxide layer 22 is removed by the etching, a thin oxide layer ($SiO_2$) 24 is formed in place thereof. While a photo resist 25 which is deposited on this oxide layer 24 is used as a mask, a P type impurity is implanted to the substrate so as to form a channel stopper embedded layer 26 therein.

Figure 3C:
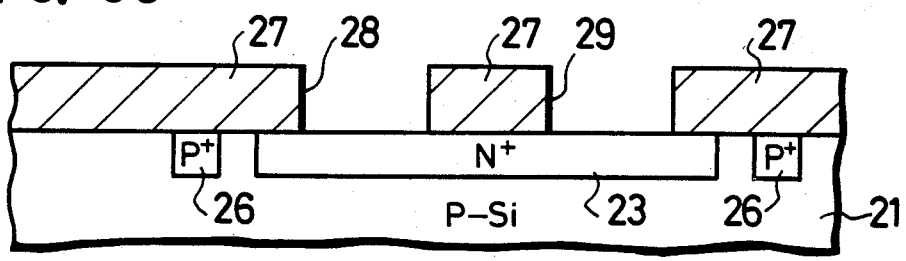

Next, as shown in FIG. 3C, an $SiO_2$ layer 27 is formed on the substrate 21 by a CVD (chemical vapor deposition) technique and then a reactive ion etching (RIE) technique and the like are used to form opening portions 28 and 29 at predetermined positions of the $SiO_2$ layer 27, namely, the portions corresponding to the active region and the collector electrode lead-out portion.

Figure 3D:
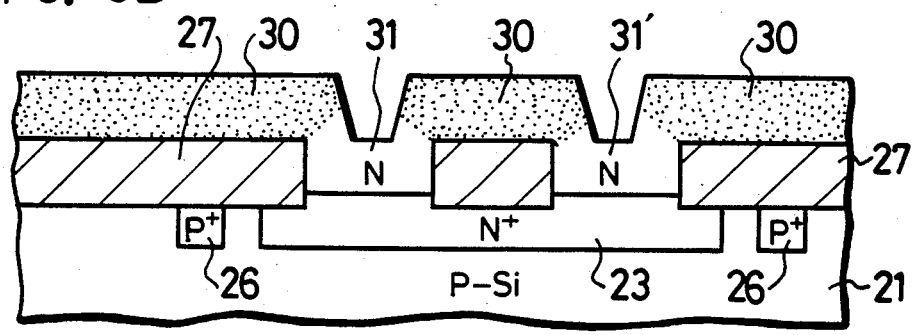

Then, as shown in FIG. 3D, $SiH_4$ is used to carry out the vapor growth, whereby to form on the $SiO_2$ layer 27 an N type polycrystalline silicon layer 30 and to form in the opening portions 28 and 29 N type single crystal silicon epitaxial layers 31 and 31' respectively. Since the polycrystalline silicon layer 30 and the epitaxial layers 31 and 31' which are formed by the vapor growth are substantially equal to one another in thickness, the portions corresponding to the opening portions 28 and 29 are formed as concave portions. Such configuration can be obtained if the crystal surface of the substrate is either of the Miller indices (100) and (111).

Figure 3E:
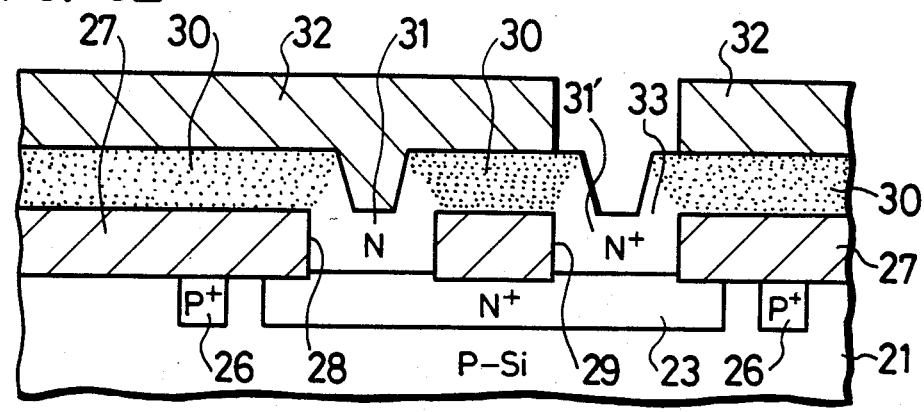

Next, as shown in FIG. 3E, while a photo resist layer 32 is used a mask, an N type impurity is implanted into the epitaxial layer 31' which is formed within the opening portion 29. Thereafter, the drive-in diffusion is carried out to form a collector electrode leading-out portion 33 of low resistance.

Figure 3F:
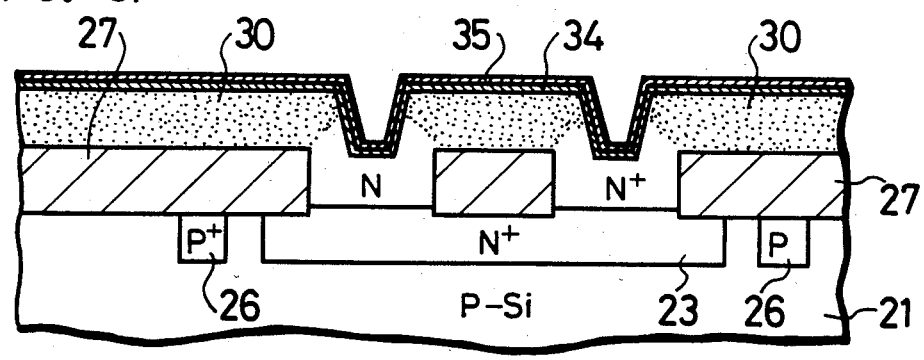

Then, as shown in FIG. 3F, after the photo resist layer 32 is removed, a thin film ($SiO_2$) 34 and a nitride layer (SiN) 35 by the CVD technique are deposited. The thickness of this oxide film 34 is preferably in a range from 200 to 500 Å, but without this oxide layer, it is possible to manufacture the semiconductor device.

Figure 3G:
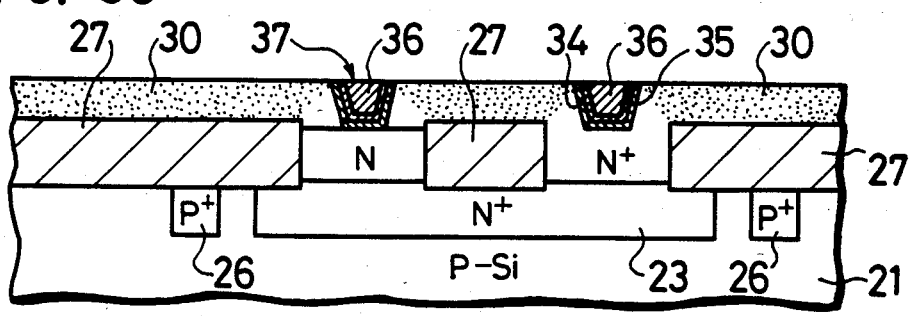

Next, as shown in FIG. 3G, after a photo resist 36 is deposited and the surface of the substrate 21 is made flat, by ion milling or reactive ion etching technique, the polycrystalline silicon layer 30 is abraded out to some extent. Since the size of a concave portion 37 is usually not higher than several micron squares, the layer can be made flat with ease. In this case, the etching technique can be carried out with good control.

Figure 3H:
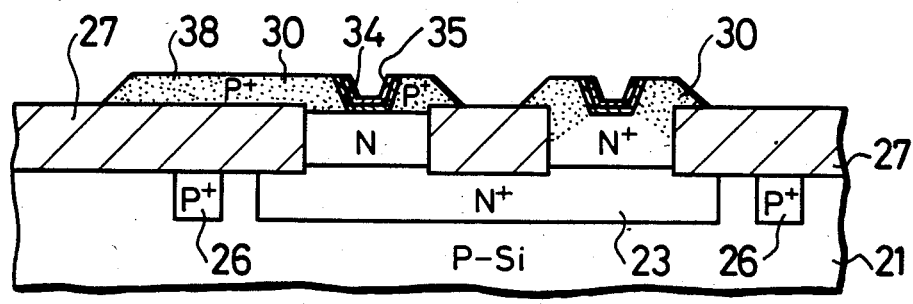

Then, as shown in FIG. 3H, a P type impurity is ion-implanted into the polycrystalline silicon layer 30. In this case, the laminated member formed of the thin oxide layer 34, the nitride layer 35 and the photo resist 36 in the concave portion 37 acts as the stopper against the ion-implantation so that no ion is implanted into the active region. Thereafter, the photo resist 36 and the undesired polycrystalline silicon layer 30 except the polycrystalline silicon layer 30 of the predetermined region are removed by etching technique to thereby form a base electrode leading-out portion 38. After the etching of this polycrystalline silicon layer 30, the annealing treatment is carried out for the diffusion. If the treatments are carried out in this sequential order, as shown in FIG. 3H, by the influence of the damage caused by the ion-milling and the ion-implantation, the polycrystalline silicon layer 30 is etched to be a taper-shape so that this polycrystalline silicon layer becomes a shape which is advantageous for the next Al wiring. On the contrary, if the annealing treatment is carried out before the undesired polycrystalline layer 30 is removed, the polycrystalline silicon layer 30 is not etched to be a taper-shape.

Figure 3I:
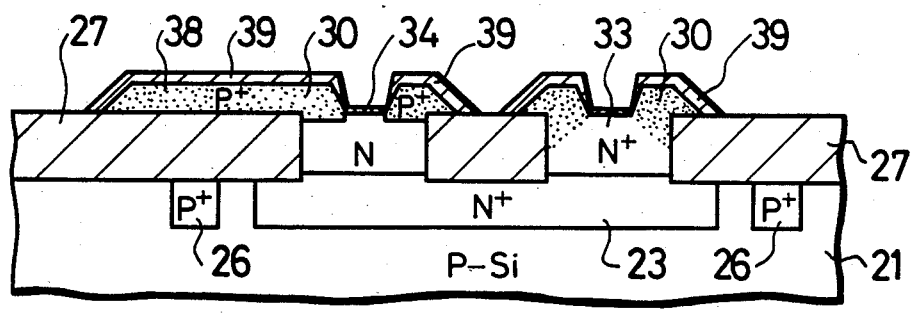

Then, as shown in FIG. 3I, while the nitride layer 35 is used as a mask, an oxide layer ($SiO_2$) 39 (as its film thickness, value $\geq 3000$ Å is appropriate) is selectively formed on the surface of the polycrystalline silicon layer 30. Thereafter the nitride layer 35 is removed. By the removing of this nitride layer 35, the window for forming the base region and the emitter region and the window of the collector electrode deriving portion 33 can be formed automatically.

Figure 3J:
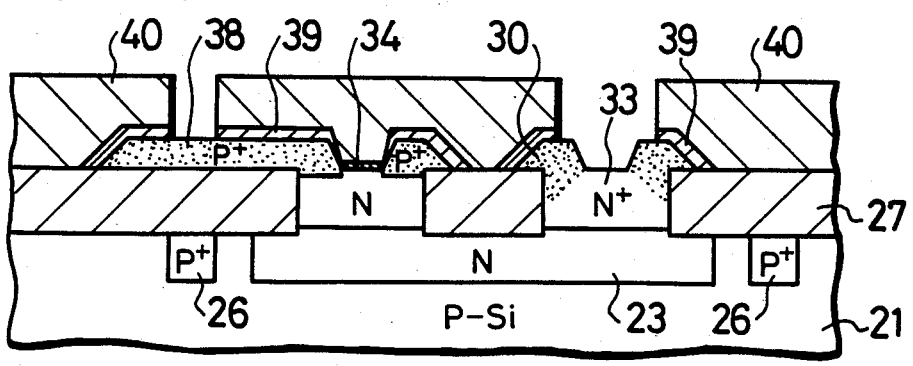

Next, as shown in FIG. 3J, a photo resist 40 is used as a mask, a window for the base electrode leading-out portion 38 is formed in the oxide layer 39 and at the same time, the opening portion of the oxide layer 39 formed on the collector electrode leading-out portion 33 is widened a little.

Figure 3K:
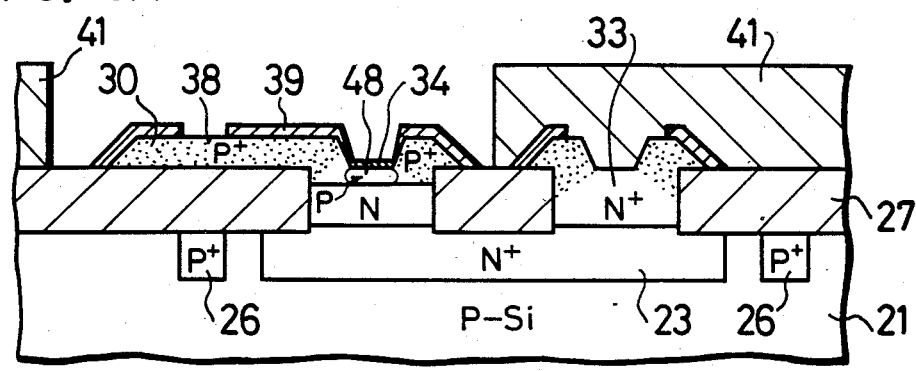

Next, as shown in FIG. 3K, the collector electrode leading-out portion 33 is masked by a photo resist 41 and a P type impurity is ion-implanted into the active region to thereby form a base region 48. At this time, the ion-implantation into the base electrode leading-out portion 38 is carried out at the same time. Thereafter, the annealing treatment is carried out.

Figure 3L:
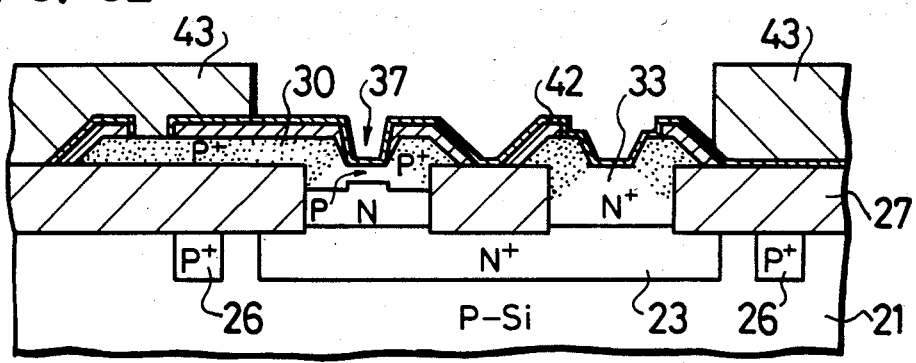

Then, as shown in FIG. 3L, after the oxide film 34 on the concave portion 37 is removed by the etching treatment, a polycrystalline silicon layer 42 for preventing Al from being penetrated thereinto is formed by CVD technique and the surface of the polycrystalline silicon layer 42 is oxidized thin as required. Then, while a photo resist 43 is used as a mask, an N type impurity, for example, arsenic As is ion-implanted into the base region 48. Thereafter, an $SiO_2$ layer (not shown) for preventing the outer diffusion is formed by the CVD technique and then the drive-in diffusion is carried out to form an emitter region 47. This $SiO_2$ layer is removed by the etching treatment and then the annealing treatment is carried out.

Figure 3M:
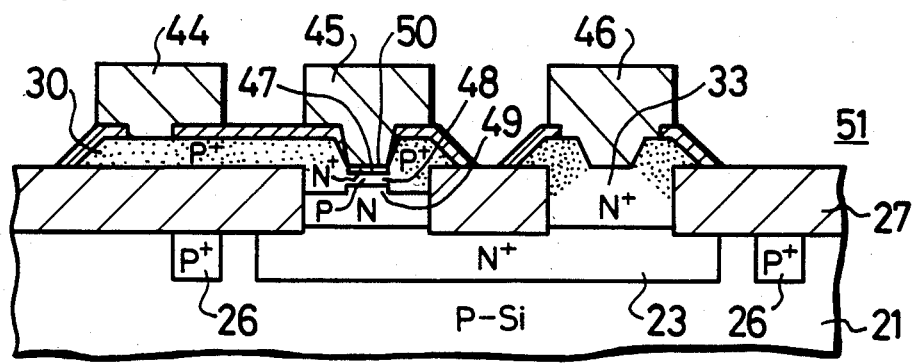

Then, as shown in FIG. 3M, after Al is deposited, a base electrode 44, an emitter electrode 45 and a collector electrode 46 are formed by the etching process and the sintering is then carried out, thus a desired bipolar transistor IC 51 being formed.

Figure 4:
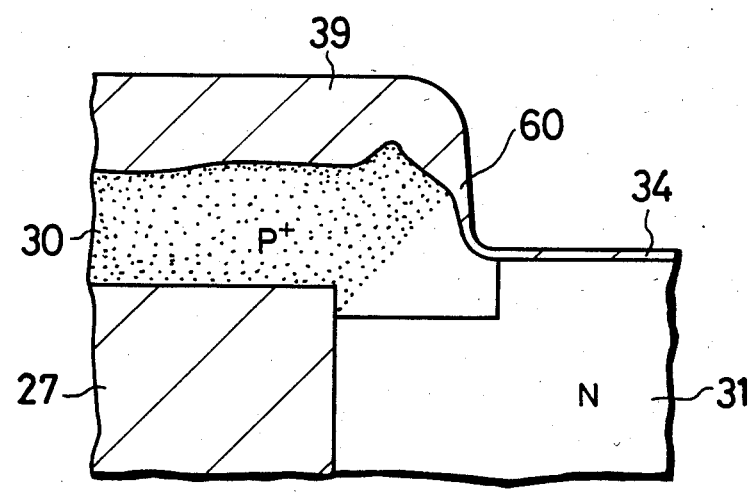
FIG. 4 is an enlarged cross-sectional view of a main part useful for explaining this invention.

If in the process as shown in FIG. 3I the invaded amount of the bird's beak is small as shown in FIG. 4, not only the oxide layer on the bottom portion of the concave portion but also the oxide layer at the side portion thereof are removed by the etching in the following process of removing the oxide film 34 in FIG. 3L. As a result, the portion between the emitter region and the base electrode leading-out portion is easily short-circuited and this becomes serious problem when this is applied to the semiconductor device in practice. In the above embodiment, this problem can be solved by selecting the thickness of the oxide layer 34 having a thin under layer to be an appropriate thickness ranging from 200 to 500 Å. However, in order to further stabilize the above portion, it is desired that the following process will be added after the process of FIG. 3I.

That is, after an $Si_3N_4$ layer or an $SiO_2$ layer is deposited by the CVD or a polycrystalline silicon layer of good covering property which is laminated thinly by the CVD is thermally oxidized, if such layer is etched by ion-milling or reactive ion-etching technique, on the basis of the shape of the concave portion, the side surface of the concave portion is not etched out but only the bottom surface thereof is etched out so that the window can be formed. Further, it is possible that the window portion is directly nitrified and then masked so as to perform the selective oxidation treatment.

The present invention as described above is the method for separating the elements instead of the prior art selective oxidation method which causes a problem since the bird's beak and bird's head are formed. In addition, when windows are formed through the SiO$_2$ layer 27 once in the process of FIG. 3C, thereafter, the collector region 49, the base region 48, the emitter region 47 and the emitter electrode leading-out region 50 can be formed in the self-alignment fashion. As a result, as compared with the prior art manufacturing method, the element can be made finer, the parasitic capacity of the collector can be reduced and hence the bipolar transistor IC of high efficiency and high integration density can be manufactured. Particularly in accordance with the manufacturing method of this invention, even if the minimum line width rule is in a range from 2 to 3 μm, it is possible to form an emitter region of less than one micron square (that is, sub-micron square).

The method for manufacturing a semiconductor device of this invention is the method for separating the elements in place of the prior art selective oxidation method which causes the problem that the bird's beak and bird's head are generated. In addition, the collector region, the base region, the emitter region and the emitter electrode leading-out region can be formed in the self-alignment fashion. Accordingly, as compared with the prior art manufacturing method, with the same line width rule as that of the prior art, the parasitic capacity of the collector can be decreased (accordingly, the portions except the active region can be decreased), the cell size can be made small, the emitter region of less than one micron square can be manufactured and so on. Thus, it is possible to manufacture a semiconductor device of high integration density and high efficiency.

We claim:

1. A method for manufacturing a semiconductor device comprising the steps of forming a semiconductive layer having formed on its surface a concave portion, forming a nitride layer within said concave portion, forming an oxide layer on a surface of said semiconductive layer with said nitride layer as a mask, removing said nitride layer, and introducing an impurity into said semiconductive layer with said oxide layer as a mask.

2. A method for manufacturing a semiconductor device according to claim 1, in which said semiconductive layer is formed on a substrate having formed on its surface a concave portion.

3. A method for manufacturing a semiconductor device according to claim 2, in which an insulating layer is selectively formed on said substrate to thereby form on its surface a concave portion.

4. A method for manufacturing a semiconductor device according to claim 1, further comprising the step of introducing an impurity into said semiconductive layer with said nitride layer as a mask.

5. A method for manufacturing a semiconductor device according to claim 1, further comprising the step of forming an insulating layer on an inside portion of said concave portion of said semiconductive layer.

6. A method for manufacturing a semiconductor device comprising the steps of forming a semiconductive layer on a substrate having concave and convex portions, forming a nitride layer on said semiconductive layer, forming a substance layer on said nitride layer and making a surface thereof substantially flat, removing other substance and nitride layers than said substance and said nitride layer so as to leave said substance layer and said nitride layer in said concave portion of said semiconductive layer, forming an oxide layer on a surface of said semiconductive layer with said nitride layer as a mask, removing said nitride layer, and introducing an inpurity into said semiconductive layer with said oxide layer as a mask.

7. A method for manufacturing a semiconductor device according to claim 6, further comprising the step of introducing an impurity into said semiconductive layer with said substance layer or nitride layer as a mask.

* * * * *